US012356832B2

(12) United States Patent
Tang

(10) Patent No.: US 12,356,832 B2
(45) Date of Patent: Jul. 8, 2025

(54) ORGANIC LIGHT-EMITTING DIODE DISPLAY PANEL AND ELECTRONIC DEVICE

(71) Applicants: Huizhou China Star Optoelectronics Display Co., Ltd., Huizhou (CN); Shenzhen China Star Optoelectronics Semiconductor Display Technology Co., Ltd., Shenzhen (CN)

(72) Inventor: Jia Tang, Huizhou (CN)

(73) Assignees: Huizhou China Star Optoelectronics Display Co., Ltd.; Shenzhen China Star Optoelectronics Semiconductor Display Technology Co., Ltd.

( * ) Notice: Subject to any disclaimer, the term of this patent is extended or adjusted under 35 U.S.C. 154(b) by 0 days.

(21) Appl. No.: 17/621,928

(22) PCT Filed: Nov. 23, 2021

(86) PCT No.: PCT/CN2021/132476
§ 371 (c)(1),
(2) Date: Dec. 22, 2021

(87) PCT Pub. No.: WO2023/082326
PCT Pub. Date: May 19, 2023

(65) Prior Publication Data
US 2024/0284757 A1    Aug. 22, 2024

(30) Foreign Application Priority Data
Nov. 15, 2021    (CN) .......................... 202111350205.9

(51) Int. Cl.
*H10K 59/80*    (2023.01)

(52) U.S. Cl.
CPC . *H10K 59/80515* (2023.02); *H10K 59/80521* (2023.02); *H10K 59/877* (2023.02)

(58) Field of Classification Search
CPC ................. H10K 59/80; H10K 59/877; H10K 59/80515; H10K 59/80521; H10K 50/16;
(Continued)

(56) References Cited

U.S. PATENT DOCUMENTS

| 11,094,904 B2 * | 8/2021 | Kim ...................... H10K 59/131 |
| 2015/0155525 A1 | 6/2015 | Sato |
| 2016/0172624 A1* | 6/2016 | Fukuda .............. H10K 50/8426 257/40 |
| 2017/0324063 A1* | 11/2017 | Ohara .................. H10K 50/828 |

(Continued)

FOREIGN PATENT DOCUMENTS

| CN | 104934461 A | 9/2015 |
| CN | 106449719 A | 2/2017 |

(Continued)

OTHER PUBLICATIONS

International Search Report in International application No. PCT/CN2021/132476, mailed on Jul. 28, 2022.
(Continued)

*Primary Examiner* — Chuong A Luu
(74) *Attorney, Agent, or Firm* — Nathan & Associates Patent Agents Ltd.; Menachem Nathan

(57) ABSTRACT

An OLED display panel and an electronic device are provided. The OLED display panel includes a substrate, a first electrode, a light-emitting layer, and a second electrode. The first electrode is disposed on a side of the substrate. The light-emitting layer is disposed on a side of the first electrode away from the substrate. The second electrode is disposed on a side of the light-emitting layer away from the first electrode. Wherein, the side of the first electrode close to the light-emitting layer has a first concave-convex surface.

17 Claims, 4 Drawing Sheets

(58) Field of Classification Search
CPC .... H10K 50/166; H10K 50/80; H10K 50/813; H10K 50/818; H10K 50/822; H10K 50/856; H10K 59/122; H10K 59/124; H10K 59/131; H10K 59/35; H10K 59/121; H10K 59/123; H10K 59/353; H10K 59/1216; H10K 59/1315; H10K 50/805
USPC .......................................................... 257/40
See application file for complete search history.

(56) References Cited

U.S. PATENT DOCUMENTS

| | | | | |
|---|---|---|---|---|
| 2018/0076270 A1* | 3/2018 | Kwon | ................. | H10K 77/111 |
| 2019/0097166 A1 | 3/2019 | Gong et al. | | |
| 2022/0037434 A1* | 2/2022 | Huang | ................. | H10K 59/124 |

FOREIGN PATENT DOCUMENTS

| | | |
|---|---|---|
| CN | 106784362 A | 5/2017 |
| CN | 107170789 A | 9/2017 |
| CN | 107195799 A | 9/2017 |
| CN | 109148730 A | 1/2019 |
| CN | 109166980 A | 1/2019 |
| CN | 110752313 A | 2/2020 |
| CN | 111029371 A | 4/2020 |
| CN | 210443585 U | 5/2020 |
| CN | 111554715 A | 8/2020 |
| CN | 112164759 A | 1/2021 |
| JP | 2012138226 A | 7/2012 |

OTHER PUBLICATIONS

Written Opinion of the International Search Authority in International application No. PCT/CN2021/132476, mailed on Jul. 28, 2022.
Chinese Office Action issued in corresponding Chinese Patent Application No. 202111350205.9 dated Sep. 27, 2022, pp. 1-8.
Chinese Office Action issued in corresponding Chinese Patent Application No. 202111350205.9 dated May 31, 2023, pp. 1-7.

* cited by examiner

ORGANIC LIGHT-EMITTING DIODE DISPLAY PANEL AND ELECTRONIC DEVICE

FIELD OF INVENTION

The present application relates to a field of display technology, particularly relate to an organic light-emitting diode (OLED) display panel and electronic device.

BACKGROUND OF INVENTION

In a current top-emitting type organic light-emitting diode (OLED) display panel, an anode of the device mainly includes silver (Ag) or aluminum (Al), and a cathode is generally a semi-permeable film, such as magnesium (Mg)/Ag. The luminous efficiency of pixels is usually improved by a cooperation of microcavity and device structure. However, an enhancement of microcavity effect and concentrated emission of emitted light will cause viewing angles of a product to be deteriorated, thereby affecting display quality, especially for large-size OLED display products.

TECHNICAL PROBLEM

At present, a common method to improve viewing angles of an organic light-emitting diode (OLED) display product is to attach an optical film on a light-emitting side of panel to increase the viewing angles by increasing light-emitting range of the device. However, the optical film will cause a loss of brightness, which may further reduce the brightness of the display product, which directly affects display quality.

SUMMARY OF INVENTION

Embodiments of the present application provide an organic light-emitting diode (OLED) display panel and an electronic device to solve the technical problem of brightness loss caused by the arrangement of the optical film in prior art OLED display products.

An embodiment of the application provides an OLED display panel. The OLED display panel includes a substrate: a first electrode disposed on a side of the substrate; a light-emitting layer disposed on a side of the first electrode away from the substrate; and a second electrode disposed on a side of the light-emitting layer away from the first electrode: wherein the side of the first electrode close to the light-emitting layer has a first concave-convex surface.

Optionally, in some embodiments of the present application, a side of the first electrode away from the light-emitting layer is a flat surface.

Optionally, in some embodiments of the present application, the OLED display panel further includes a concave-convex structure disposed between the substrate and the first electrode, wherein a surface of the concave-convex structure in contact with the first electrode has a second concave-convex surface, and the second concave-convex surface matches the first concave-convex surface.

Optionally, in some embodiments of the present application, the OLED display panel further includes a planarization layer, and the planarization layer is located between the substrate and the concave-convex structure.

Optionally, in some embodiments of the present application, the OLED display panel further includes a planarization layer, the planarization layer is located between the substrate and the first electrode, wherein a portion of the planarization layer in contact with the first electrode is the concave-convex structure Optionally, in some embodiments of the present application, the second concave-convex surface includes a plurality of convex surfaces, and a concave portion is defined between two adjacent convex surfaces.

Optionally, in some embodiments of the present application, the convex surface includes a first inclined surface, and an included angle between the first inclined surface and a plane where the substrate is located ranges from 5° to 80°.

Optionally, in some embodiments of the present application, in a direction perpendicular to a plane where the substrate is located, a shape of the convex surface includes at least one of a triangle, a square, a trapezoid, a semi-ellipse, or a semicircle.

Optionally, in some embodiments of the present application, the second concave-convex surface includes a plurality of concave surfaces, and a convex portion is formed between two adjacent concave surfaces.

An embodiment of the present application further provides an OLED display panel. The OLED display panel includes: a substrate: a planarization layer disposed on a side of the substrate; a first electrode disposed on a side of the planarization layer away from the substrate: a light-emitting layer disposed on a side of the first electrode away from the planarization layer: and a second electrode disposed on a side of the light-emitting layer away from the first electrode; wherein, the side of the first electrode close to the light-emitting layer has a first concave-convex surface, a portion of the planarization layer in contact with the first electrode is a concave-convex structure, a surface of the concave-convex structure in contact with the first electrode has a second concave-convex surface, the second concave-convex surface matches the first concave-convex surface, the second concave-convex surface includes a plurality of convex surfaces, and a concave portion is defined between two adjacent convex surfaces.

Optionally, in some embodiments of the present application, the convex surface includes a first inclined surface, and an included angle between the first inclined surface and a plane where the substrate is located ranges from 5° to 80°.

An embodiment of the present application further provides an electronic device. The electronic device includes a housing and an OLED display panel disposed in the housing. The OLED display panel includes: a substrate: a first electrode disposed on a side of the substrate: a light-emitting layer disposed on a side of the first electrode away from the substrate; and a second electrode disposed on a side of the light-emitting layer away from the first electrode: wherein the side of the first electrode close to the light-emitting layer has a first concave-convex surface.

Optionally, in some embodiments of the present application, a side of the first electrode away from the light-emitting layer is a flat surface.

Optionally, in some embodiments of the present application, the OLED display panel further includes a concave-convex structure. The concave-convex structure is disposed between the substrate and the first electrode, and wherein a surface of the concave-convex structure in contact with the first electrode has a second concave-convex surface, and the second concave-convex surface matches the first concave-convex surface.

Optionally, in some embodiments of the present application, the OLED display panel further includes a planarization layer. The planarization layer is located between the substrate and the concave-convex structure.

Optionally, in some embodiments of the present application, the OLED display panel further includes a planarization layer. The planarization layer is located between the substrate and the first electrode, and wherein a portion of the planarization layer in contact with the first electrode is the concave-convex structure.

Optionally, in some embodiments of the present application, the second concave-convex surface includes a plurality of convex surfaces, and a concave portion is defined between two adjacent convex surfaces.

Optionally, in some embodiments of the present application, the convex surface includes a first inclined surface, and an included angle between the first inclined surface and a plane where the substrate is located ranges from 5° to 80°.

Optionally, in some embodiments of the present application, in a direction perpendicular to a plane where the substrate is located, a shape of the convex surface includes at least one of a triangle, a square, a trapezoid, a semi-ellipse, or a semicircle.

Optionally, in some embodiments of the present application, the second concave-convex surface includes a plurality of concave surfaces, and a convex portion is formed between two adjacent concave surfaces.

Beneficial Effect

The organic light-emitting diode (OLED) display panel provided by the present application includes a substrate, a first electrode, a light-emitting layer, and a second electrode that are sequentially arranged. In the present application, a side of the first electrode close to the light-emitting layer is provided with a first concave-convex surface so that the light emitted from the light-emitting layer to the first electrode can be diffusely reflected on the first concave-convex surface, and then it emits from the first concave-convex surface toward the light-emitting layer. While increasing the viewing angles, the brightness loss of the light-emitting layer can be reduced, and the light utilization rate of the light-emitting layer can be improved. Therefore, the brightness and the display quality of the OLED display product can be improved.

DESCRIPTION OF DRAWINGS

In order to describe the technical solutions in the embodiments of the present application more clearly, the following will briefly introduce the drawings that need to be used in the description of the embodiments. The drawings in the following description are only some embodiments of the application. For those skilled in the art, other drawings can be obtained based on these drawings without doing creative work.

DETAILED DESCRIPTION OF PREFERRED EMBODIMENTS

Figure 1:
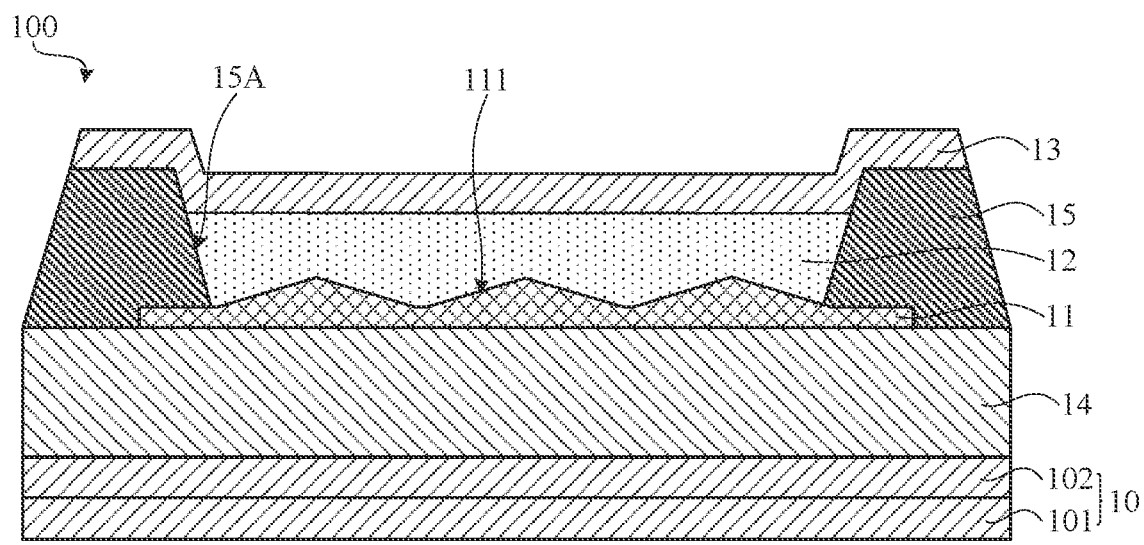
FIG. 1 is a schematic structural diagram of an organic light-emitting diode (OLED) display panel provided by a first embodiment of the present application.

The following will clearly and completely describe the technical solutions in the embodiments of the present application with reference to the drawings in the embodiments of the present application. Obviously, the embodiments are only a part of the embodiments of the present application, rather than all the embodiments. Based on the embodiments in the present application, all other embodiments obtained by those skilled in the art without doing creative work shall fall within the protection scope of the present application. In addition, the specific implementations described herein are only used to illustrate and explain the present application, and are not used to limit this application. In the present application, if no explanation is made to the contrary, the orientation words used such as "upper" and "lower" usually refer to the upper and lower positions of the device in actual use or working state. Specifically, it is the direction of the drawing, and "inner" and "outer" refer to the outline of the device.

This application provides an organic light-emitting diode (OLED) display panel and electronic device. Detailed descriptions are given below. It should be noted that the order of description in the following embodiments is not meant to limit the preferred order of the embodiments.

This application provides an OLED display panel. The OLED display panel includes a substrate, a first electrode, a light-emitting layer, and a second electrode. The first electrode is disposed on a side of the substrate, the light-emitting layer is disposed on a side of the first electrode away from the substrate, and the second electrode is disposed on a side of the light-emitting layer away from the first electrode, wherein, the side of the first electrode close to the light-emitting layer has a first concave-convex surface.

In the present application, a side of the first electrode close to the light-emitting layer is provided with a first concave-convex surface, so that the light emitted from the light-emitting layer to the first electrode can be diffusely reflected on the first concave-convex surface, and then is emitted from the first concave-convex surface to the light-emitting layer. While increasing the viewing angles, the brightness loss of the light-emitting layer can be reduced, and the light utilization rate of the light-emitting layer can be improved. Therefore, the brightness and the display quality of the OLED display product can be improved.

It should be noted that, in this application, the first electrode may be an anode and the second electrode may be a cathode, or the first electrode may be a cathode and the second electrode may be an anode. The following embodiments of the present application only take the first electrode as the anode and the second electrode as the cathode for description but are not limited thereto.

The OLED display panel provided by the present application will be described in detail below through specific embodiments.

Please refer to FIG. 1, the first embodiment of the present application provides an OLED display panel 100. The OLED display panel 100 includes a substrate 10, a first electrode 11, a light-emitting layer 12, and a second electrode 13. The first electrode 11 is disposed on a side of the substrate 10. The light-emitting layer 12 is disposed on a side of the first electrode 11 away from the substrate 10. The second electrode 13 is disposed on a side of the light-emitting layer 12 away from the first electrode 11. Wherein, the first electrode 11 has a first concave-convex surface 111 on a side close to the light-emitting layer 12.

Specifically, the substrate 10 includes a base 101 and a thin film transistor layer 102 disposed on a side of the base 101 close to the first electrode 11. The base 101 may be a rigid base, such as a glass base, or the base 101 may also be a flexible base, such as a polyimide base. It should be noted that the thin film transistor layer 102 includes a thin film transistor and an insulating film layer (not shown in the figure), and the related structure can refer to the prior art, which will not be described herein.

A planarization layer 14 is provided between the substrate 10 and the first electrode 11. The surface of the planarization layer 14 close to the first electrode 11 is a flattened surface. It can be understood that the flattened surface is compared to a rough surface such as an uneven surface. Wherein, the material of the planarization layer 14 may be an organic resin.

The OLED display panel 100 further includes a pixel definition layer 15. The pixel definition layer 15 is located on the side of the first electrode 11 away from the planarization layer 14. The pixel definition layer 15 is defined with an opening 15A. The opening 15A exposes the first electrode 11. The light-emitting layer 12 is disposed in the opening 15A.

The side of the first electrode 11 away from the light-emitting layer 12 is a flat surface. It is understandable that the flat surface of the first electrode 11 is compared to a rough surface such as an uneven surface. The first electrode 11 is disposed on a flat layer with a flattened surface to form a flat surface. The material of the first electrode 11 may include at least one of silver (Ag), aluminum (Al), or Indium tin oxide (ITO). The first electrode 11 may have a single-layer, double-layer, or multilayer structure. In this embodiment, the first electrode 11 may be a laminated structure of ITO/Ag/ITO.

The second electrode 13 covers the light-emitting layer 12 and the pixel definition layer 15. The material of the second electrode 13 may include Ag and/or magnesium (Mg). In this embodiment, the second electrode 13 may be a single layer structure of Ag.

It should be noted that, in this embodiment, a hole injection layer and/or a hole transport layer and other functional film layers (not shown in the figure) may also be provided between the first electrode 11 and the light-emitting layer 12. A functional film layer (not shown in the figure) such as an electron injection layer and/or an electron transport layer may also be provided between the light-emitting layer 12 and the second electrode 13. The related structure can refer to the prior art, which will not be described herein.

In the OLED display panel 100 provided by the first embodiment of the present application, the surface of the first electrode 11 close to the light-emitting layer 12 is provided as the first concave-convex surface 111 so that the light emitted from the light-emitting layer 12 to the first electrode 11 can be diffusely reflected on the first concave-convex surface 111, and then it emits from the first concave-convex surface 111 toward the light-emitting layer 12. Therefore, while increasing the viewing angles, the brightness loss of the light-emitting layer 12 can be reduced, and the light utilization rate of the light-emitting layer 12 can be improved so that the brightness and the display quality of the OLED display product can be improved.

Figure 2:
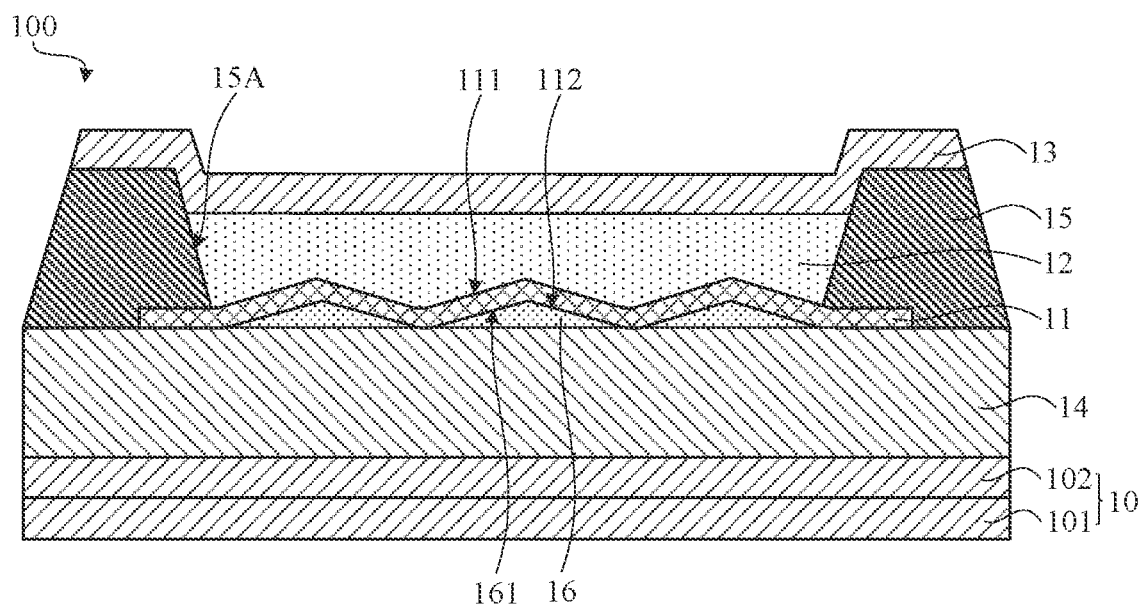
FIG. 2 is a schematic structural diagram of an OLED display panel provided by a second embodiment of the present application.

Please refer to FIG. 2, a second embodiment of the present application provides an OLED display panel 100. The difference between the OLED display panel 100 provided in the second embodiment and the OLED display panel provided in the first embodiment of the present application is: The OLED display panel 100 further includes a concave-convex structure 16 disposed between the planarization layer 14 and the first electrode 11. The surface of the concave-convex structure 16 contacting the first electrode 11 has a second concave-convex surface 161. The surface of the first electrode 11 away from the light-emitting layer 12 is a third concave-convex surface 112. The third concave-convex surface 112 matches the first concave-convex surface 111.

It can be understood that the term "match" described in this embodiment means that the two surfaces have the same degree of curvature. For example, when the surfaces of the second concave-convex surface 161 and the first concave-convex surface 111 are both flat surfaces, "the second concave-convex surface 161 matches the first concave-convex surface 111" means that the slope of any plane on the second concave-convex surface 161 is the same as the slope of a corresponding plane on the first concave-convex surface 111. When the surfaces of the second concave-convex surface 161 and the first concave-convex surface 111 are both curved surfaces, "the second concave-convex surface 161 matches the first concave-convex surface 111" means that the curvature of a point on any curved surface of the second concave-convex surface 161 is the same as the curvature of a corresponding point on the first concave-convex surface 111.

In this embodiment, the surface of the concave-convex structure 16 in contact with the first electrode 11 is the second concave-convex surface 161. Due to the influence of the topography of the concave-convex structure 16, the first concave-convex surface 111 is formed after the first electrode 11 is disposed on the concave-convex structure 16. In addition, the material of the concavo-convex structure 16 may be the same as the material of the planarization layer 14, and both are organic resins.

In the OLED display panel 100 provided by the second embodiment of the present application, the concave-convex structure 16 is disposed between the first electrode 11 and the planarization layer 14. The first electrode 11 with the first concave-convex surface 111 is formed by the topography advantage of the concave-convex structure 16 so that the light emitted from the light-emitting layer 12 to the surface of the first electrode 11 can be diffusely reflected on the first concave-convex surface 111. Then, it is emitted from the first concave-convex surface 111 toward the light-emitting layer 12, thereby increasing the viewing angles while reducing the brightness loss of the light-emitting layer 12. In addition, the light utilization rate of the light-emitting layer 12 is improved, thereby improving the brightness of the OLED display product and improving the display quality.

Figure 3:
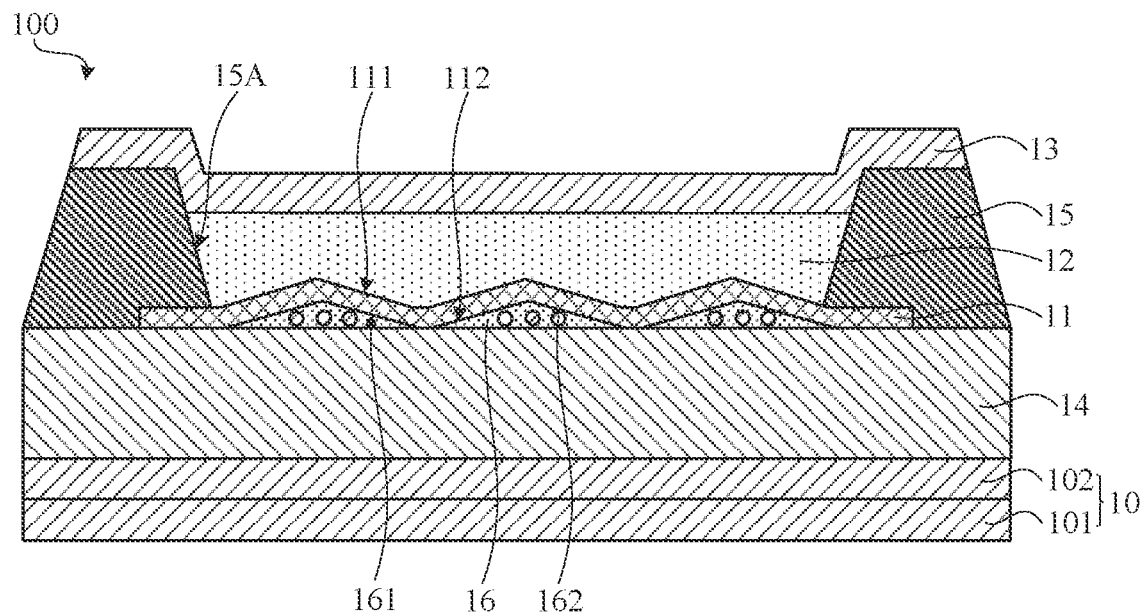
FIG. 3 is a schematic structural diagram of an OLED display panel provided by a third embodiment of the present application.

Please refer to FIG. 3, a third embodiment of the present application provides an OLED display panel 100. The difference between the OLED display panel 100 provided by the third embodiment of the present application and the second embodiment is that the concave-convex structure 16 is doped with scattering particles 162.

Specifically, the scattering particles 162 may include at least one of $TiO_2$ particles, $ZrO_2$ particles, $SiO_2$ particles, or $TiO_2$ particles.

In this embodiment, by doping scattering particles in the concave-convex structure 16, part of the light entering the concave-convex structure 16 through the first electrode 11 can be scattered under the action of the scattering particles 162 and emitted toward the light-emitting layer 12 through multiple reflections. Therefore, the light utilization rate of the light-emitting layer 12 can be further improved so that the brightness loss of the light-emitting layer 12 can be further reduced.

Figure 4:
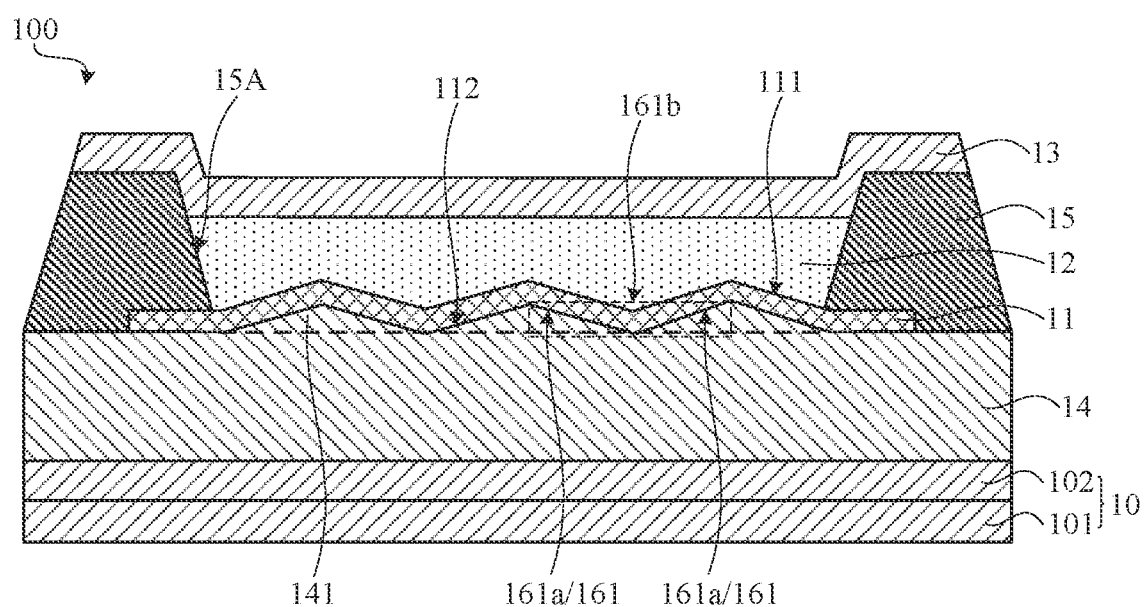
FIG. 4 is a schematic structural diagram of an OLED display panel provided by a fourth embodiment of the present application.

Please refer to FIG. 4, a fourth embodiment of the present application provides an OLED display panel 100. The difference between the OLED display panel 100 provided by the fourth embodiment of the present application and the first embodiment is: The portion of the planarization layer 14 in contact with the first electrode 11 is a concave-convex structure 141, the surface of the concave-convex structure 141 contacting the first electrode 11 has a second concave-convex surface 161, and the second concave-convex surface 161 matches the first concave-convex surface 111. The surface of the first electrode 11 away from the light-emitting layer 12 is a third concave-convex surface 112. The third concave-convex surface 112 matches the first concave-convex surface 111.

It can be understood that the "match" described in this embodiment means that the two surfaces have the same degree of curvature. For example, when the surfaces of the second concave-convex surface 161 and the first concave-convex surface 111 are both flat surfaces, "the second concave-convex surface 161 matches the first concave-convex surface 111" means that the slope of any plane on the second concave-convex surface 161 is the same as the slope of the corresponding plane on the first concave-convex surface 111. When the surfaces of the second concave-convex surface 161 and the first concave-convex surface 111 are both curved surfaces, "the second concave-convex surface 161 matches the first concave-convex surface 111" means that the curvature of a point on any curved surface of the second concave-convex surface 161 is the same as the curvature of a corresponding point on the corresponding curved surface of the first concave-convex surface 111.

In this embodiment, the second concave-convex surface 161 may be formed by a photolithography process. The second concave-convex surface 161 includes a plurality of convex surfaces 161a. A concave portion 161b is formed between two adjacent convex surfaces 161a.

Figure 5:
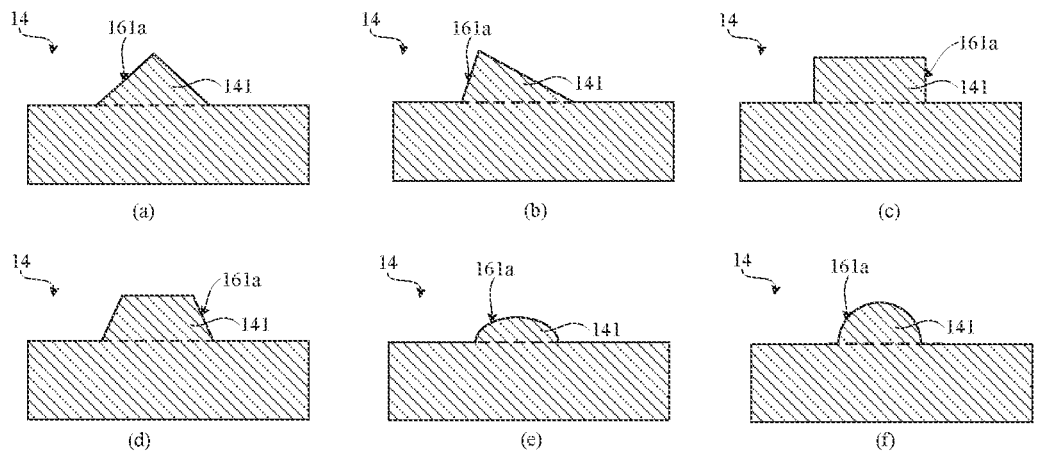
FIG. 5(a)-(5f) are schematic structural diagrams of different embodiments of the OLED display panel provided by the present application, in which their second concave-convex surfaces have the same convex surface shape.

In the direction perpendicular to the plane where the substrate 10 is located, the cross-sectional shapes of the convex surfaces 161a on the second concave-convex surface 161 may be the same. Wherein, the cross-sectional shape of the convex surface 161a includes one of a triangle, a trapezoid, a square, a semi-ellipse, or a semicircle. As shown in FIG. 5 (a) to FIG. 5(f), FIG. 5(a) to FIG. 5(f) respectively illustrate the structural schematic diagrams when the cross-sectional shape of the convex surface 161a is an isosceles triangle, a non-isosceles triangle, a square, a trapezoid, a semi-ellipse, or a semicircle. It should be noted that, for the convenience of describing the present application, the aforesaid drawings only illustrate a schematic structural diagram of a convex surface 161a on the second concave-convex surface 161, but it is not limited thereto.

Figure 6:
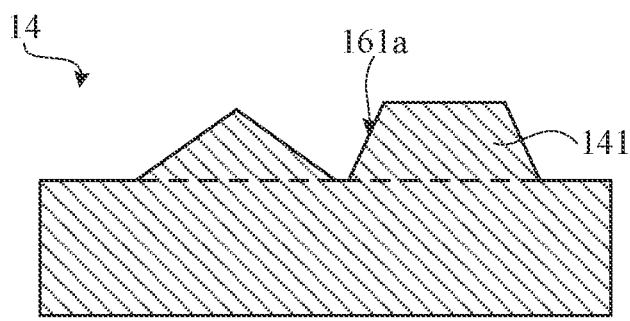
FIG. 6 is a schematic structural diagram of an OLED display panel provided by the present application, in which the second concave-convex surface has different convex surface shapes.

In some embodiments, in the direction perpendicular to the plane where the substrate 10 is located, the cross-sectional shapes of the convex surfaces 161a on the second concave-convex surface 161 may also be different. Wherein, the cross-sectional shapes of the convex surfaces 161a include at least two of a triangle, a trapezoid, a square, a semi-ellipse, or a semicircle. As shown in FIG. 6, FIG. 6 illustrates a schematic structural diagram when the cross-sectional shapes of the convex surface 161a include an isosceles triangle and a trapezoid. It should be noted that the cross-sectional shapes of the convex surfaces 161a in the present application can be any combination of the aforesaid shapes, and will not be repeated herein.

Figure 7:
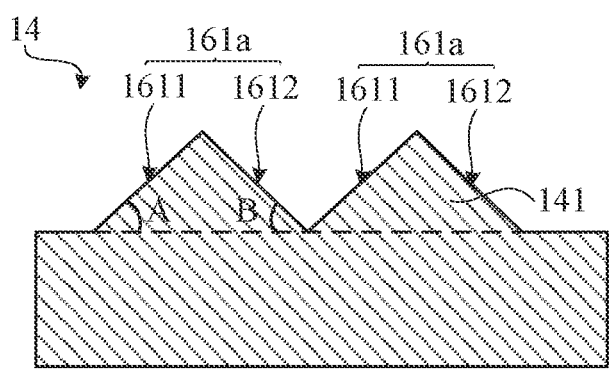
FIG. 7 is a schematic structural diagram of an OLED display panel provided by the present application, in which two adjacent convex surfaces of the second concave-convex surface are connected.
Figure 8:
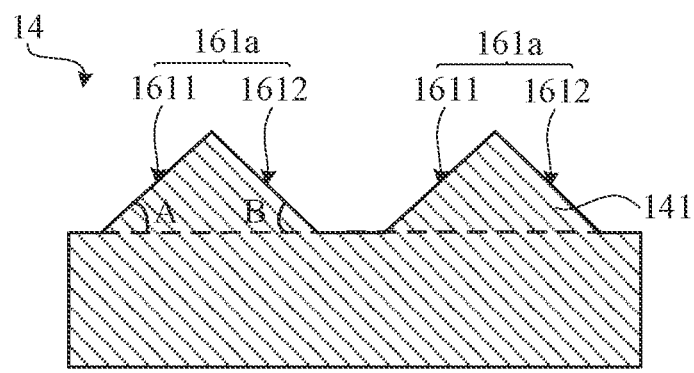
FIG. 8 is a schematic structural diagram of an OLED display panel provided by the present application, in which two adjacent convex surfaces of the second concave-convex surface are arranged at intervals.

Taking the cross-sectional shape of the convex surface 161a as a triangle as an example, as shown in FIG. 7, the convex surface 161a includes a first inclined surface 1611 and a second inclined surface 1612 connected to the first inclined surface 1611. In this embodiment, the convex surfaces 161a on the second concave-convex surface 161 are connected to each other, and the first inclined surface 1611 of one convex surface 161a is connected to the second inclined surface 1612 of an adjacent convex surface 161a. In the aforesaid arrangement, by providing a continuous convex surface 161a, a continuous diffuse reflection surface is formed on the surface of the first electrode 11, thereby maximizing the diffuse reflection effect of light on the first concave-convex surface 111, thereby greatly improving the utilization rate of the light. As shown in FIG. 8, in some embodiments, the convex surfaces 161a on the first concave-convex surface 111 may also be arranged at intervals. That is, there is a flattened surface (not shown in the figure) between the first inclined surface 1611 of one convex surface 161a and the second inclined surface 1612 of another adjacent convex surface 161a.

Please continue to refer to FIG. 7 and FIG. 8. Further, in this embodiment, the included angle A between the first inclined surface 1611 and the plane where the substrate 10 is located and the included angle B between the second inclined surface 1612 and the plane where the substrate 10 is located range from 5° to 80°. Within the above range, the light has a better reflection effect on the first inclined surface 1611 and the second inclined surface 1612, which can significantly increase the utilization rate of the light. Wherein, the included angle A and the included angle B may be the same or different. This embodiment only illustrates the structure when the included angle A and the included angle B are the same, but it is not limited to this. In some specific embodiments, the aforesaid included angle can be 5°, 10°, 20°, 25°, 30°, 40°, 50°, 60°, 65°, 70°, 75°, or 80°.

In some embodiments, it is also possible to set only one of the included angle A between the first inclined surface 1611 and the plane where the substrate 10 is located or the included angle B between the second inclined surface 1612 and the plane where the substrate 10 is located to be ranged from 5° to 80°, which will not be repeated herein.

In the OLED display panel 100 provided by the fourth embodiment of the present application, the portion of the planarization layer 14 close to the first electrode 11 is provided as a concave-convex structure 141. The first electrode 11 with the first concave-convex surface 111 is formed by the topography advantage of the concave-convex structure 141 so that the light emitted from the light-emitting layer 12 to the surface of the first electrode 11 can be diffusely reflected on the first concave-convex surface 111. Then, it is emitted from the first concave-convex surface 111 toward the light-emitting layer 12, thereby increasing the viewing angles while reducing the brightness loss of the light-emitting layer 12. In addition, the light utilization rate of the light-emitting layer 12 is improved, thereby improving the brightness of the OLED display product, and improving the display quality. In addition, because the first concave-convex surface 111 of this embodiment is directly formed on the planarization layer 14 having the concave-convex structure 141, therefore, in the manufacturing process, only the patterning process of the planarization layer 14 is required, so that the process cost is not increased.

Figure 9:
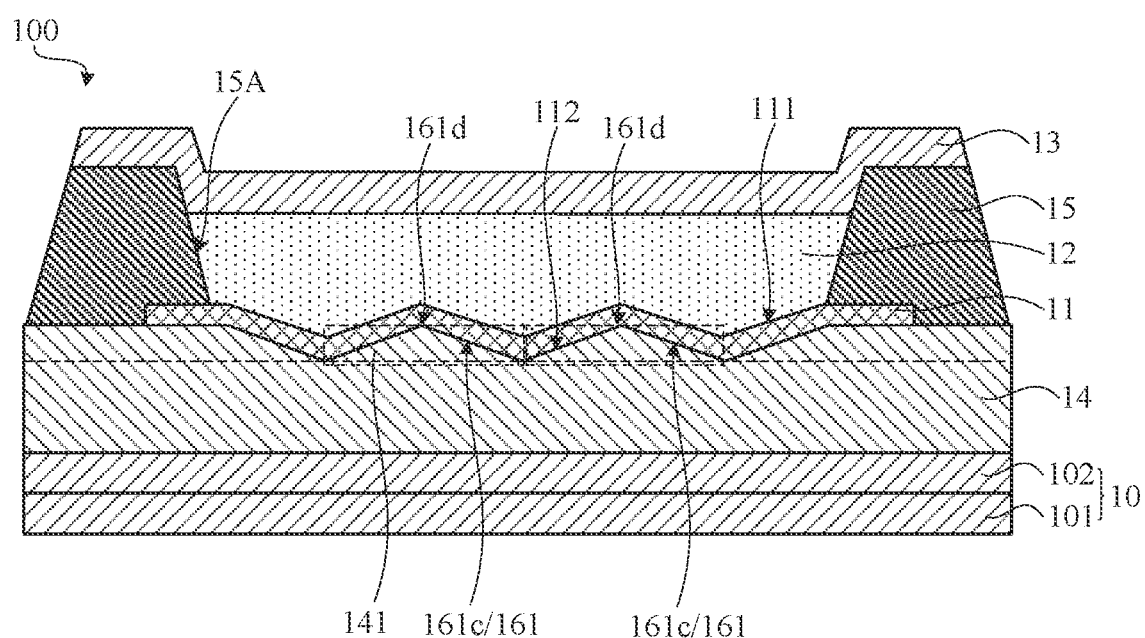
FIG. 9 is a schematic structural diagram of an OLED display panel provided by a fifth embodiment of the present application.

Please refer to FIG. 9, a fifth embodiment of the present application provides an OLED display panel 100. The difference between the OLED display panel 100 provided in the fifth embodiment and the fourth embodiment of the present application is as follows: The second concave-convex surface 161 includes a plurality of concave surfaces 161c, and a convex portion 161d is formed between two adjacent concave surfaces 161c.

It should be noted that in the direction perpendicular to the plane of the substrate 10, the cross-sectional shape of the convex portion 161d may be the same as the cross-sectional shape of the convex surface 161a in the aforesaid fourth embodiment. For the related structure, reference may be made to the description of the foregoing embodiment, which will not be repeated herein.

The embodiment of the present application further provides an electronic device. The electronic device may be a display product such as a mobile phone, a tablet, a notebook computer, or a television. Wherein, the electronic device includes a housing and an OLED display panel disposed in the housing, The OLED display panel is the OLED display panel described in any of the foregoing embodiments. For the specific structure of the OLED display panel, reference may be made to the description of the foregoing embodiment, which will not be repeated herein.

The above describes in detail an OLED display panel and electronic device provided by the embodiments of the present application. Specific examples are used in this article to illustrate the principles and implementation of the application, and the descriptions of the above examples are only used to help understand the methods and core ideas of the application. In addition, for those skilled in the art, according to the ideas of this application, there will be changes in the specific implementation and the scope of the application. As mentioned above, the content of this specification should not be construed as a limitation to this application.

What is claimed is:

1. An OLED display panel, comprising:
a substrate;
a first electrode disposed on a side of the substrate;
a light-emitting layer disposed on a side of the first electrode away from the substrate; and
a second electrode disposed on a side of the light-emitting layer away from the first electrode;
wherein, the side of the first electrode close to the light-emitting layer has a first concave-convex surface;
wherein the OLED display panel further comprises a concave-convex structure disposed between the substrate and the first electrode, the concave-convex structure is doped with scattering particles, and the scattering particles comprise at least one of $TiO_2$ particles, $ZrO_2$ particles, $SiO_2$ particles, or $TiO_2$ particles; and
wherein the OLED display panel further comprises a planarization layer disposed between the substrate and the concave-convex structure, the planarization layer covers an entire of the substrate, and a surface of the planarization layer in contact with the concave-convex structure is a flat surface, and the first electrode is spaced from the substrate through the planarization layer.

2. The OLED display panel of claim 1, wherein a surface of the concave-convex structure in contact with the first electrode has a second concave-convex surface, and the second concave-convex surface matches the first concave-convex surface.

3. The OLED display panel of claim 2, further comprising a planarization layer disposed between the substrate and the concave-convex structure.

4. The OLED display panel of claim 2, wherein a portion of the planarization layer in contact with the first electrode is the concave-convex structure.

5. The OLED display panel of claim 2, wherein the second concave-convex surface comprises a plurality of convex surfaces, and a concave portion is formed between two adjacent convex surfaces.

6. The OLED display panel of claim 5, wherein the convex surface comprises a first inclined surface, and an included angle between the first inclined surface and a plane where the substrate is located ranges from 5° to 80°.

7. The OLED display panel of claim 5, wherein in a direction perpendicular to a plane where the substrate is located, a shape of the convex surface comprises at least one of a triangle, a square, a trapezoid, a semi-ellipse, or a semicircle.

8. The OLED display panel of claim 2, wherein the second concave-convex surface comprises a plurality of concave surfaces, and a convex portion is formed between two adjacent concave surfaces.

9. An OLED display panel, comprising:
a substrate;
a planarization layer disposed on a side of the substrate;
a first electrode disposed on a side of the planarization layer away from the substrate;
a light-emitting layer disposed on a side of the first electrode away from the planarization layer; and
a second electrode disposed on a side of the light-emitting layer away from the first electrode;
wherein, the side of the first electrode close to the light-emitting layer has a first concave-convex surface, a portion of the planarization layer in contact with the first electrode is a concave-convex structure, the concave-convex structure is doped with scattering particles, the scattering particles comprise at least one of $TiO_2$ particles, $ZrO_2$ particles, $SiO_2$ particles, or $TiO_2$ particles, a surface of the concave-convex structure in contact with the first electrode has a second concave-convex surface, the second concave-convex surface matches the first concave-convex surface, the second concave-convex surface comprises a plurality of convex surfaces, and a concave portion is formed between two adjacent convex surfaces; and
wherein the planarization layer covers an entire of the substrate, and a surface of the planarization layer in contact with the concave-convex structure is a flat surface, and the first electrode is spaced from the substrate through the planarization layer.

10. The OLED display panel of claim 9, wherein the convex surface comprises a first inclined surface, and an included angle between the first inclined surface and a plane where the substrate is located ranges from 5° to 80°.

11. An electronic device, comprising a housing and an OLED display panel disposed in the housing, wherein the OLED display panel comprises:
  a substrate;
  a first electrode disposed on a side of the substrate;
  a light-emitting layer disposed on a side of the first electrode away from the substrate; and
  a second electrode disposed on a side of the light-emitting layer away from the first electrode;
  wherein, the side of the first electrode close to the light-emitting layer has a first concave-convex surface;
  wherein the OLED display panel further comprises a concave-convex structure disposed between the substrate and the first electrode, the concave-convex structure is doped with scattering particles, and the scattering particles comprise at least one of $TiO_2$ particles, $ZrO_2$ particles, $SiO_2$ particles, or $TiO_2$ particles; and
  wherein the OLED display panel further comprises a planarization layer disposed between the substrate and the concave-convex structure, the planarization layer covers an entire of the substrate, and a surface of the planarization layer in contact with the concave-convex structure is a flat surface, and the first electrode is spaced from the substrate through the planarization layer.

12. The electronic device of claim 11, wherein a surface of the concave-convex structure in contact with the first electrode has a second concave-convex surface, and the second concave-convex surface matches the first concave-convex surface.

13. The electronic device of claim 12, wherein a portion of the planarization layer in contact with the first electrode is the concave-convex structure.

14. The electronic device of claim 12, wherein the second concave-convex surface comprises a plurality of convex surfaces, and a concave portion is formed between two adjacent convex surfaces.

15. The electronic device of claim 14, wherein the convex surface comprises a first inclined surface, and an included angle between the first inclined surface and a plane where the substrate is located ranges from 5° to 80°.

16. The electronic device of claim 14, wherein in a direction perpendicular to a plane where the substrate is located, a shape of the convex surface comprises at least one of a triangle, a square, a trapezoid, a semi-ellipse, or a semicircle.

17. The electronic device of claim 12, wherein the second concave-convex surface comprises a plurality of concave surfaces, and a convex portion is formed between two adjacent concave surfaces.

* * * * *